United States Patent [19]

Liu

[11] 4,278,755
[45] Jul. 14, 1981

[54] HALFTONE SCREEN AND METHOD OF USING SAME

[75] Inventor: Hua-Kuang Liu, Tuscaloosa, Ala.

[73] Assignee: Lumin, Inc., Tuscaloosa, Ala.

[21] Appl. No.: 69,907

[22] Filed: Aug. 27, 1979

Related U.S. Application Data

[62] Division of Ser. No. 894,902, Apr. 10, 1978, Pat. No. 4,188,225.

[51] Int. Cl.³ .............................................. G03F 5/00
[52] U.S. Cl. ....................................... 430/396; 430/6; 430/7; 430/22; 350/322
[58] Field of Search ....................... 430/6, 7, 22, 396; 350/322

[56] References Cited

U.S. PATENT DOCUMENTS

| | | | |
|---|---|---|---|
| 1,370,885 | 3/1921 | Frederick et al. | 350/188 |
| 2,183,204 | 12/1939 | Reynolds | 350/322 |
| 2,292,313 | 8/1942 | Yule | 350/322 |
| 2,719,790 | 10/1955 | Monroy | 350/322 |
| 3,565,527 | 2/1971 | Crespi | 355/71 |
| 3,737,321 | 6/1973 | Torr et al. | 350/322 |
| 3,746,540 | 7/1973 | Rarey | 430/11 |
| 3,814,608 | 6/1974 | Middlemiss | 350/322 |

Primary Examiner—Edward C. Kimlin
Attorney, Agent, or Firm—Harry E. Aine; Harvey G. Lowhurst

[57] ABSTRACT

An improved halftone dot screen for use in reproduction of continuous-tone graphic images is disclosed. The screen comprises a two-dimensional matrix of cells (dots) each cell having a common pattern of transmittance to radiation utilized in the reproduction process. The common pattern of transmittance for each cell is characterized by a finite number of different discrete transmittance level patterns. In a preferred embodiment, these patterns include portions arranged along the respective sides of a parallelogram. In one preferred embodiment, the discrete transmittance level patterns comprise an array of concentric parallelograms. Each parallelogram has a plurality of dot portions arranged along the sides of the parallelogram. The sides of the parallelogram patterns are preferably disposed at a substantial angle to the horizontal to reduce moiré and rosette pattern effects and to simplify the reproduction process.

9 Claims, 4 Drawing Figures

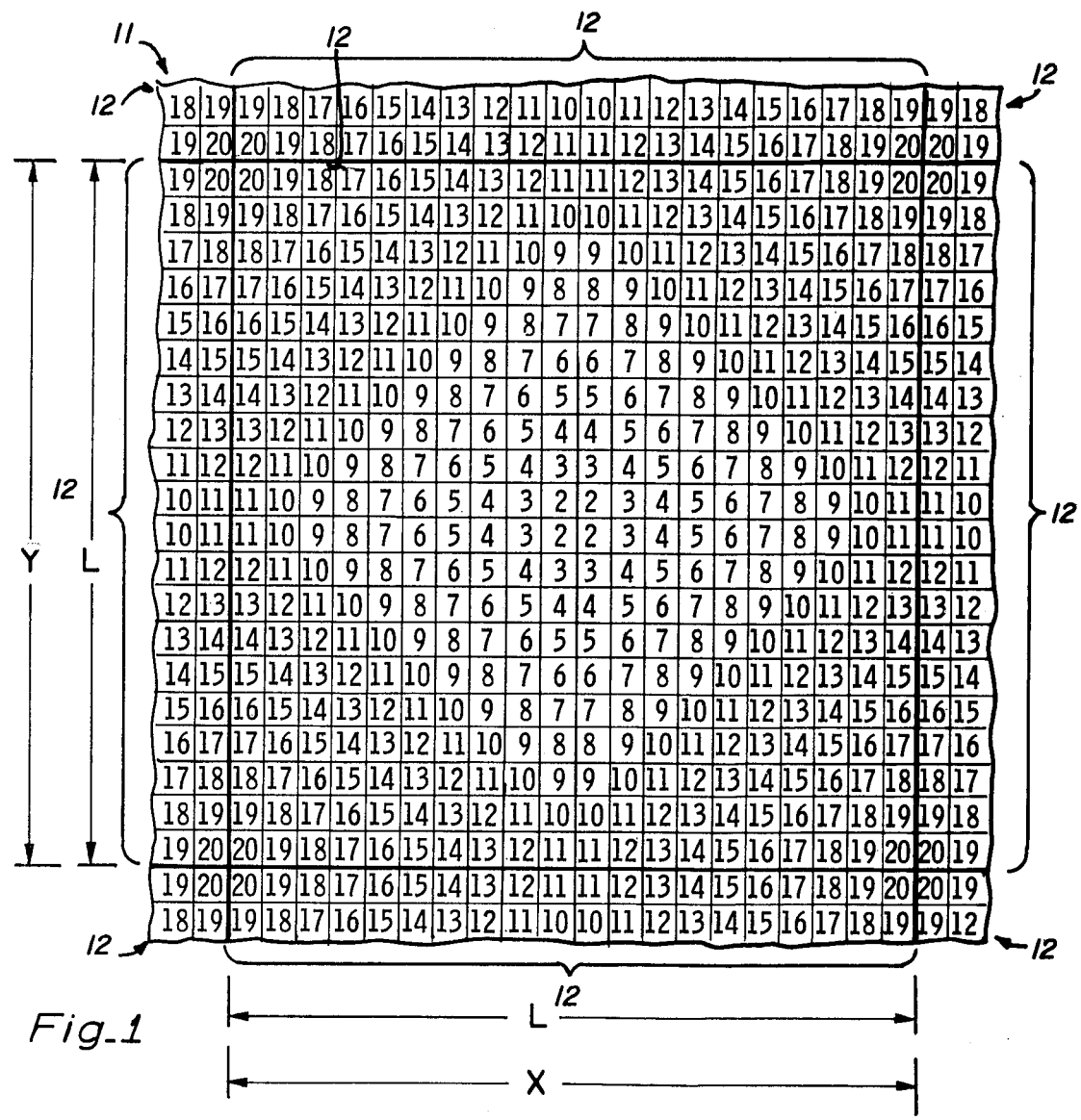
Fig_1
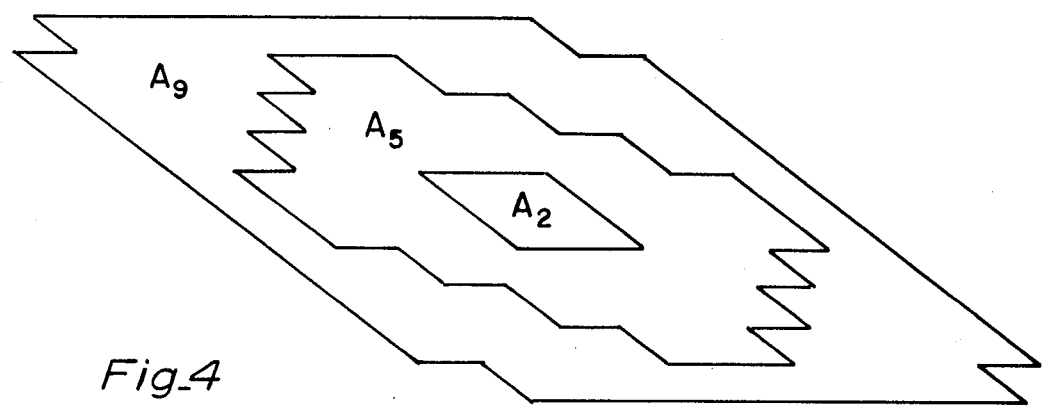
Fig_4

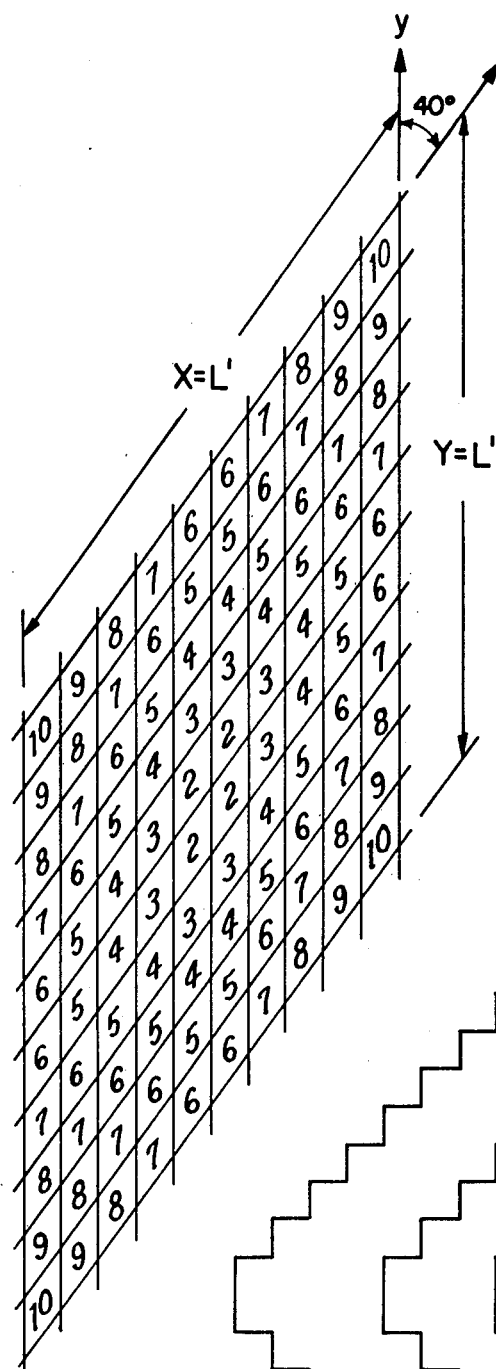
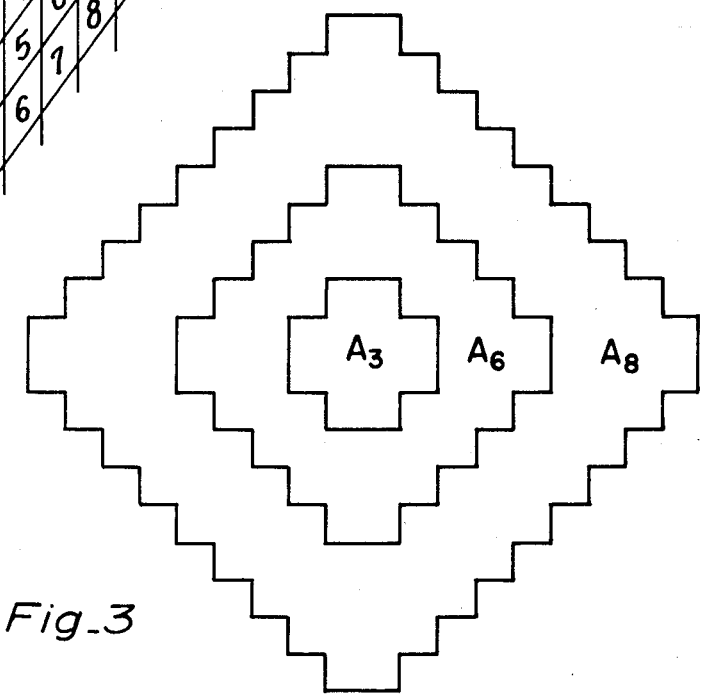
Fig. 2
Fig. 3

HALFTONE SCREEN AND METHOD OF USING SAME

This is a division of application Ser. No. 894,902, filed Apr. 10, 1978, now U.S. Pat. No. 4,188,225.

RELATED CASES

Applicant has a copending U.S. Application, Ser. No. 708,539 titled "Method of Making Halftone Screens", filed July 26, 1976, now abandoned in favor of continuation application U.S. Ser. No. 960,446 filed Nov. 13, 1978, now abandoned.

BACKGROUND OF THE INVENTION

The present invention relates in general to halftone dot screens utilized for reproduction of continuous-tone graphic images.

DESCRIPTION OF THE PRIOR ART

Heretofore, a number of different types of halftone dot screens have been employed in the reproduction of continuous-tone graphic images. Examples of such prior art screens include ones having patterns formed by crossed lines, (or contact dot screens derived from them) eliptical screens, and irregular screens including pebble grain screens, mezzograph screens and several other types of novelty screens.

In the graphic arts, irregular screens are sometimes preferred since the moiré and other unwanted patterns, including clumping, checkerboard, and rosette patterns, can be reduced or eliminated, but with regular screens this is not possible. The various screen patterns used in reproduction of continuous-tone graphic are disclosed and discussed in an article appearing in Applied Optics Vol. 13 No. 7, of July 1974, pgs. 1703-1710.

There are several different types of screen patterns, none of which are entirely satisfactory for reproduction of continuous-tone graphics and particularly for use in polychromatic reproductions.

Therefore, it is desired to provide an improved screen pattern useful in reproduction of continuous-tone graphics which can avoid some of the undesirable pattern effects in the reproductions and which can simplify the reproduction process, particularly with regard to reproducing polychromatic graphics.

SUMMARY OF THE PRESENT INVENTION

The principal object of the present invention is the provision of an improved halftone dot screen and method of using same.

In one feature of the present invention, a halftone dot screen for use in reproduction of continuous-tone graphics includes a screen pattern comprising a two-dimensional matrix of cell portions each cell portion having a common pattern of optical transmittance characterized by a finite number of different discrete transmittance level patterns each transmittance level pattern having portions arranged along the respective sides of a parallelogram.

In another feature of the present invention, the optical transmittance level patterns found in each of the cells comprises a plurality of dots unit areas of a given transmittance level arranged along the sides of a respective parallelogram.

In another feature of the present invention, the parallelograms of the different discrete transmittance level patterns within each cell are arranged relative to the horizontal so that the sides of the parallelograms make a substantial angle with the horizontal.

In another feature of the present invention, the unit areas of transmittance of each transmittance level pattern are of a parallelogram shape.

In another feature of the present invention, the improved screen of the present invention is employed for reproduction of continuous-tone graphics by exposing a high contrast medium, such as a film, to the continuous-tone graphic image to be reproduced through the screen of the present invention to produce a corresponding dot exposure pattern with the dots having an area corresponding to the tone of the graphic image in the region of the respective dot, then producing a printing plate from the exposed pattern for printing continuous-tone graphic images. The reproduction of continuous-tone graphic images should also include electro-optical process, Xerox process, telecommunication image transmission process, etc.

In another feature of the present invention, polychromatic reproductions are produced by employing the screen of the present invention and exposing a high contrast medium, such as a film, to the continuous-tone graphic image through the screen of the present invention when illuminated with different color light so as to produce a plurality of dot exposure patterns, one for each of the different colors (such as the three primary colors) to be employed in the reproduction, producing printing plates from the respective exposure dot patterns and then superimposing the printed dot pattern images for each of the respective color printing plates so as to produce a polychromatic reproduction.

The reproduction of continuous-tone polychromatic graphic images should also include electro-optical process, Xerox process, tele-communication image transmission process, etc.

Other features and advantages of the present invention will become apparent upon a perusal of the following specification taken in connection with the accompanying drawings wherein;

BRIEF DESCRIPTION OF THE DRAWINGS

FIG. 1 is a schematic representation of one of the cells of a halftone screen of the present invention with X and Y coordinates at 90° to each other and depicting the various different transmittance intensity level patterns with the different levels of transmittance being indicated by different numerals and transmittance of a given intensity value being that region of the cell containing unit areas of transmittance level of a given number;

FIG. 2 is a plot similar to that of FIG. 1 depicting one cell of a halftone set screen of the present invention wherein the X and Y coordinates are displaced by 40° relative to each other;

FIG. 3 shows the superimposed isophote dot patterns produced by a screen of the type depicted in FIG. 1; and FIG. 4 shows superimposed isophote dot patterns produced by the screen of the type depicted in FIG. 2.

DESCRIPTION OF PREFERRED EMBODIMENT

The dot halftone screen 11 of the present invention comprises a two-dimensional matrix of cells 12 each cell being identical and having a finite number of different discrete transmittance levels arranged in well-defined regions within the area of each cell. In a preferred embodiment, each cell is of a parallelogram shape such as the square shape of FIG. 1. The patterns are defined by each discrete transmittance intensity level and are formed by a plurality of unit areas of uniform transmittance level each of a parallelogram shape, such as square in the case of FIG. 1. The centers of the unit areas of uniform transmittance level are arranged along the sides of parallelograms having common centers, i.e., concentric. The sides of the parallelograms, are preferably inclined at a substantial angle to the horizontal to facilitate avoidance of certain undesired patterns such as moiré patterns heretofore obtained in the reproduction of continuous-tone graphic images.

For the dot halftone screen 11 of FIG. 1, the transmittance function is defined along a vertical direction, y-direction, which may or may not be made to be perpendicular to the x-direction, i.e., horizontal direction in FIG. 1. Let Y be the length of the halftone cell along the y-direction, M be the number of the discrete transmittance levels along the y-direction in the cell, and $T_m^S$ be a transmittance level of the cell. Let Y be divided into M divisions of $\Delta y_1, \Delta y_2, \ldots \Delta y_M$ such that $$\sum_{m=1}^{M} \Delta y_m = Y \qquad \text{Eq. (1)}$$

If we let $\Delta y_o = 0$, and then we can write a transmittance function along the y-direction within $-Y/2 \leq y \leq Y/2$ by $$T_Y^S(y) = \qquad \text{Eq. (2)}$$

$$\sum_{m=1}^{M} T_m^S \left[ u\left(y - \sum_{k=1}^{m} (\tfrac{1}{2})\Delta y_{m-1}\right) - u\left(y - \sum_{k=1}^{m} (\tfrac{1}{2})\Delta y_m\right) + u\left(y + \sum_{k=1}^{m} (\tfrac{1}{2})\Delta y_m\right) - u\left(y + \sum_{k=1}^{m} (\tfrac{1}{2})\Delta y_{m-1}\right) \right],$$

where $u(\theta)$ is a unit-step function defined by $$u(\theta) = 1, \theta \geq 0 \qquad \text{Eq. (3)}$$
$$= 0, \theta < 0.$$

The transmittance functions of the complete line halftone screen (assuming infinite size for simplicity) can be described by $$T^S(y) = T_Y^S(y) * \left[ \sum_{j=-\infty}^{\infty} \delta(y - jY) \right], \qquad \text{Eq. (4)}$$

where j is always an integer, and the symbol "*" denotes the convolution integral and the delta function $\delta(\theta)$ is defined by
$\delta(\theta) = 1$, for $\theta = 0$
$= 0$, for $\theta \neq 0$.

Eq. (5)

The transmittance function of the halftone screen along the x-direction is described as follows:

Let X be the length of the halftone cell along the x-direction, and N be the number of the discrete transmittance levels in the cell. Further, we shall let $T_n^s$ be a transmittance level of the halftone cell and X be divided into N divisions of $\Delta x_1, \Delta x_2, \ldots, \Delta x_N$ such that $$\sum_{n=1}^{N} \Delta x_n = X. \qquad \text{Eq. (6)}$$

If we let $\Delta x_o = 0$, then the transmittance function of a line halftone cell can be expressed analytically by $$T_X^S(x) = \sum_{n=1}^{N} T_n^S \left\{ \left[ u\left(x - \sum_{k=1}^{n} (\tfrac{1}{2})\Delta x_{k-1}\right) - u\left(x - \sum_{k=1}^{n} (\tfrac{1}{2})\Delta x_k\right) + u\left(x + \sum_{k=1}^{n} (\tfrac{1}{2})\Delta x_k\right) - u\left(x + \sum_{k=1}^{n} (\tfrac{1}{2})\Delta x_{k-1}\right) \right] \right\}, \qquad \text{Eq. (7)}$$

where $u(\theta)$ is a unit-step function defined by Eq. (3).

The transmittance function of the complete line halftone screen (assuming infinite size for simplicity) can be described by $$T^S(x) = T_X^S(x) * \left[ \sum_{i=-\infty}^{\infty} \delta(x - iX) \right], \qquad \text{Eq. (8)}$$

where i is always an integer and where, the symbol "*" denotes the convolution integral and the delta function $\delta(\theta)$ is defined by Eq. (5).

The optical intensity transmittance function of the dot screen (two dimensional screen), $T^S(x,y)$, is defined as the multiplication of $T^S(x)$ of Equation (8) and $T^S(y)$ of Equation (4).

Namely, $$T^S(x,y) = T^S(x) T^S(y). \qquad \text{Eq. (9)}$$

One of the special cases for the dot screen of the present invention is where the length of the halftone cell X is equally divided into N parts such that $\Delta x_n = \Delta x = X/N$ for $n = 1, 2, \ldots N$. Under this condition Equation (7) may be written as $$T_X^S(x) = \qquad \text{Eq. (10)}$$

$$\sum_{n=1}^{N} T_n^S \left\{ u[x - (\tfrac{1}{2})(n-1)\Delta x] - u\left[x - \tfrac{n}{2}\Delta x\right] + u\left[x + \tfrac{n}{2}\Delta x\right] - u[x - (\tfrac{1}{2})(n-1)\Delta x] \right\},$$

where $u[\theta] \equiv u(\theta)$, which is defined in Equation (3).

The transmittance function as given by Equation (8) remains unchanged.

In addition to the condition leading to Equation (10), the length Y of the halftone cell along the y-direction is also equally divided into M parts such that $\Delta y_m = \Delta y = Y/M$ for $m = 1, 2, \ldots, M$. Under this condition, Equation (2) becomes $$T_Y^S(y) = \sum_{m=1}^{M} T_m^S \left\{ u[y - (\tfrac{1}{2})(m-1)\Delta y] - u\left[y - \tfrac{m}{2}\Delta y\right] + u\left[y + \tfrac{m}{2}\Delta y\right] - u[y + (\tfrac{1}{2})(m-1)\Delta y] \right\} \qquad \text{Eq. (11)}$$

For $-\infty \leq y \leq +\infty$, Equation (4) remains unchanged. The (two dimensional) dot screen optical intensity transmittance function for this special case is also given by Equation (9) where Equations (10) and (11) are implicitly contained respectively in $T^S(x)$ and $T^S(y)$ through Equations (8) and (4).

Two examples follow to illustrate the transmittance profile of the dot screens 11 of FIG. 1, and the transmittance profile of the dot screen as shown in FIG. 2.

EXAMPLE I

Let the x-direction and the y-direction in the halftone cell be perpendicular to each other and for simplicity, for each halftone cell, let $X=Y=L$, and $N=M=10$. Let the positive Arabic numerals k distinguish the various levels of the combined transmittance $T^S(k) = T^S(x) T^S(y)$, then the transmittance profile of one of the halftone cells is shown in FIG. 1. There are 19 different values of transmittance $T^S(k)$ where k varies consecutively from 2 to 2N (which in this case is 20). Let $T^S(k) > T^S(k')$ if $k < k'$. The transmittance function in the halftone cell is distinctly quantized into a finite number of discrete levels. Furthermore, note that through the following analysis, a better understanding of the halftone cell is gained.

Let the number of unit areas (the small squares of $$\frac{L}{20} \times \frac{L}{20}$$

each) as shown in FIG. 1 of intensity transmittance $T^S(k)$ be denoted by $U_k$ and let $U_1 = 0$, then it is shown that in general, $$U_k = 4(k-1), N+1 \geq k \geq 1 \qquad \text{Eq. (12)}$$
$$= 4(2N-k+1), 2N \geq k > N+1.$$

Since $T^S = (k) > T^S(k')$ for $k < k'$, when the halftone cell is contact printed into a high contrast negative medium, such as a film, the number of unit areas permissible isophotes $A_k$ can be written in terms of $U_k$ by $$A_k = \sum_{l=1}^{k} U_l \text{ for } K \geq 1. \qquad \text{Eq. (13)}$$

For the case $N=10$, $k=1, 2, \ldots, 20$, the values of $U_k$ and $A_k$ are listed in Table I below. It can be seen from the Table that $U_k$ increases linearly till $k=N+1=11$ and then decreases linearly till $k=20$. Such a variation of $U_k$ makes the variation of $A_k$ versus k approximately linear.

EXAMPLE II

Let the x-direction and y-direction in the halftone cell be at 40° to each other. One halftone cell of this type is shown in FIG. 2. This is an example to illustrate that the angle between x-direction and y-direction need not be 90°. Also for simplicity, let $X=Y=L$, and $M=N=5$. Analogous to Example I, $U_k$ and $A_k$ versus k for $k=1, 2, \ldots 10$ are listed in Table II, below.

In the utilization of the halftone dot screens, the conventional process of contact printing of the original continuous-tone photograph and the screen to a photosensitive material is maintained. The photosensitive material is preferably a high gamma negative film and due to the effect of the halftone cell, a finite number of distinctively different opaque dot patterns will be produced. The area of these dots ranges from zero up to the full size of the halftone cell itself. Three of these respective half-tone opaque dot patterns are illustrated in the directly superimposed positions in FIG. 3; and in FIG. 4.

It can be seen from FIG. 3 that the sawtooth edges of the opaque dot patterns are naturally oriented at 45° and 135° from the horizontal edges of the halftone cell. Therefore, the step of the rotation of the screen to an orientation such that the screen lines (the edges of the halftone cell) are at 45° and 135° to the horizontal, as in the conventional black-and-white or monochromatic reproduction, is not needed when the improved screen of the present invention is used.

In polychromatic reproduction, the conventional process of the rotation of the orientation of the three or four color separated halftone pictures has proved to be tedious and troublesome. The selection of the angle of separation 30° from one another for the three primary colors is completely based on experience. Obviously, if the 45° and 135° orientation is found to be the best orientation for the black-and-white and monochromatic reproduction, then the angular orientations (for those colors) that are different from 45° and 135° must be less than ideal choices that are forced by circumstances. When the halftone screen of the present invention is used, the rotation of the color-separated printing plates (or the halftone screens) is unnecessary and undesirable, since all directly superposed dot patterns corresponding to all the colors are all arranged in the same most preferred orientation (45° or 135°) already.

In the new method of the present invention for polychromatic reproduction, direct and exact superposition of the inks of the three primary colors, used with the color-separated printing plates, is employed. The superimposed printed patterns corresponding to a single halftone cell of the halftone screen, shown in FIG. 1, is shown in FIG. 3. The isophote dot patterns $A_3$, $A_6$ and $A_8$ resulting from use of the screen of FIG. 1 are superimposed. In the printed results, $A_3$ may be occupied by any one of the three colored inks, say yellow; $A_6$, say magenta; and $A_8$, say cyan. The assignment of these subtractive primary colors to the three patterns depends on the color of the original at the location of the halftone cell. Because of the subtractive nature of the primary colors, in the present assignment, the area $A_3$ should appear black; $A_6$, blue; and $A_8$, remains to be cyan. A fourth color, black, as in the conventional polychromatic reproduction is no longer needed.

Of course, any combinations of the colors and sizes are possible under the restriction of the available dot patterns. With the screens of the type described in FIG. 1, a variety of $20 \times 20 \times 20 = 8000$ different combinations of the three colors can be made within the area of the halftone cell, because there are 20 different dot area patterns (including the pattern of zero area) available. These combinations are far greater than any human visual system is able to discriminate, hence a quasi-continuous-tone color image can be reproduced.

The individual isophote dot area can vary from total blank (zero area) to fully (full cell area), therefore a quasi-continuous-tone black-and-white variation can also be achieved. In addition, because of the availability of the large number of combinations of colors, highly faithful reproduction of the original color can be obtained. In addition, all the superimposed dot patterns have side edges oriented in the same optimum direction, i.e. 45° or 135°, from the horizontal direction thereby minimizing undesired pattern effects and avoiding rotation of the printing plates.

In a typical screen example, the cell period L of the halftone screen is approximately 250 μm. It was found that a broad range of tone variation in the resultant black-and-white print is achieved. Even with purposeful misalignment of the cyan and magenta inks, vivid color reproduction is obtained without the appearance of the most commonly seen rosette patterns.

The screen 11 of FIG. 1 is readily fabricated employing the dot screen method described in the aforecited copending U.S. Application Ser. No. 708,539, now abandoned. The isophote dot patterns are produced on high contrast film, such as Kodak PAN film.

Some advantages of using the halftone screens of the present invention in the new printing process are summarized below:

No rotation of the screens are needed in black-and-white, monochromatic, or polychromatic reproductions. This saves a lot of effort in the printing process. Because of no rotation, and because the orientation of the dot patterns for all the printing plates are naturally 45° or 135° from the horizontal axis, best printing results are achieved. No fourth color (usually black) is needed in the color reproduction and better results can be achieved.

The finite and discrete number of halftone cell transmittance levels are completely controllable. Because of the approximately linear characteristic of the $A_k$ versus k curve as shown in FIG. 2 only a single exposure is required to take into account all of the tone variations that include the highlight, middle tone detail and shadow in a black-and-white copy. This is in contrast to the conventional printing process where three exposures are made using decreasing apertures for the highlight, detail and shadow. The resultant dot structure of the conventional printing process is a complex combination of the effects of the three aperture stops and the tone variations of the original. The selection of the three exposures for the tone control is based on the experience and artistic talent of the plate maker. This artistic (unscientific) aspect of the conventional printing process is avoided by the use of the halftone screens 11 of the present invention.

A great improvement in the fidelity of color reproduction is achieved by the use of the halftone screens 11 of the present invention because of the exact and direct on-the-top of one another superposition of the three colored halftone printing plates. The mixture of colors at every location is based on the uniform mixing of the dots of the three colored inks centered at the common center of the corresponding halftone cell. The mixing of color can be analytically computed based on the shapes and sizes of the halftone dots and the CIE diagram. In contrast, the conventional color printing process has the dots separated by rotation and is therefore difficult to evaluate.

Resolution of the color production is greatly improved by the use of the halftone screens 11 of the present invention in the new printing process. Because of the exact and direct superposition of the colored printing plates, the spatial resolution is increased. Therefore, comparing with the conventional color printing results, more coarse halftone screens of the present invention and more inferior papers can be used to achieve the same or even better reproductions.

Unwanted patterns are eliminated in the color reproduction by the use of the present screens 11. Moiré patterns, rosettes, and checkerboard patterns that are commonly seen in conventional color work are either greatly reduced or completely eliminated. The elimination of rosettes and checkerboard patterns is a natural consequence of the direct on-the-top screen superposition process. The reduction of the moiré patterns is probably due to the fact that less aliasing occurs due to the unique and particular halftone cell patterns.

The halftone screens 11 not only can be used directly in the mono- and poly-chromtaic reproductions including the multicolor Xerox and other multicolor electrostatic printing process, optical color analysis devices, but can also be used in optical data transmission process, optical encoding process, color television shadow screen design, etc.

TABLE I
$U_k$ and $A_k$ versus k for the dot screen of Example I.

| k | No. of unit areas of intensity transmittance $T^S(k)$ | No. of unit areas of permissable isophotes |
|---|---|---|
| 1 | 0 | 0 |
| 2 | 4 | 4 |
| 3 | 8 | 12 |
| 4 | 12 | 24 |
| 5 | 16 | 40 |
| 6 | 20 | 60 |
| 7 | 24 | 84 |
| 8 | 28 | 112 |
| 9 | 32 | 144 |
| 10 | 36 | 180 |
| 11 | 40 | 220 |
| 12 | 36 | 256 |
| 13 | 32 | 288 |
| 14 | 28 | 316 |
| 15 | 24 | 340 |
| 16 | 20 | 360 |
| 17 | 16 | 376 |
| 18 | 12 | 388 |
| 19 | 8 | 396 |
| 20 | 4 | 400 |

TABLE II
$U_k$ and $A_k$ versus k for the dot screen of Example II.

| k | $U_k$ | $A_k$ |
|---|---|---|
| 1 | 0 | 0 |
| 2 | 4 | 4 |
| 3 | 8 | 12 |
| 4 | 12 | 24 |
| 5 | 16 | 40 |
| 6 | 20 | 60 |
| 7 | 16 | 76 |
| 8 | 12 | 88 |
| 9 | 8 | 96 |
| 10 | 4 | 100 |

Briefly, the method for fabricating the dot screen 11, as described in the aforecited copending U.S. Application Ser. No. 708,539, is to expose a wide dynamic range negative glass plate or film with incoherent light through a contact mask comprising a Ronchi ruling. After a first exposure, the film or glass plate is translated relative to the ruling in a direction orthogonal to the direction of the lines by a distance a/n for each of n−2 translations and is sequentially exposed for each translation where n is the number of different transmittance levels to be formed in the screen and where a is the period of the Ronchi ruling. The density profile of the exposed film or plate is controlled by the exposure time employed. After the film has been translated and exposed as above described, the Ronchi ruling is rotated relative to the glass plate or film by a certain angle, i.e., 90 degrees for the example of FIG. 1, from its original angular position and the procedure repeated. The exposed plate or film is then developed to form the screen.

What is claimed is:

1. In a method of using a screen for reproduction of continuous-tone graphics, the steps of:

exposing a high contrast medium to the continuous tone graphic image to be reproduced through a screen pattern to produce a corresponding dot exposure pattern on the high contrast medium, said exposure dots having a size corresponding to the tone of the graphic image in the region of the respective dot, said screen pattern being characterized by comprising a two-dimensional matrix of cell portions each cell portion having a common pattern of transmittance to radiation to be directed through said screen pattern, said common pattern of transmittance having a plural finite number of different discrete transmittance level patterns, each cell being characterized by sets of unit areas, each set of unit areas having a uniform optical transmittance level, with each set of unit areas having a discrete optical transmittance level differing from each other set of unit areas within the cell by a well-defined combination of unit step functions being functions of two variables, one variable being the distance to the point where the optical transmittance level is evaluated from the boundary of a first side of said cell, and the other variable being the distance of said point from the boundary of the side adjacent said first side of said cell.

2. The method of claim 1 wherein each discrete transmittance level has portions arranged along the respective side of a respective parallelogram.

3. The method of claim 1 wherein each set of unit areas of a discrete transmittance level pattern comprises a series of unit areas of a discrete transmittance level with the centers of the respective unit areas of a set being arranged along the respective sides of a respective parallelogram.

4. The method of claim 3 wherein the respective unit areas are of a parallelogram shape.

5. The method of claim 2 wherein respective parallelograms for respective ones of said discrete transmittance level patterns are concentric.

6. The method of claim 4 wherein two side edges of the respective unit areas are perpendicular to the horizontal.

7. The method of claim 4 wherein the side edges of the parallelogram patterns for respective sets of said discrete transmittance levels are at a substantial angle to the horizontal.

8. The method of claim 4 wherein adjacent unit areas which are disposed along one side of a respective parallelogram pattern for a respective discrete transmittance level are free of a common side edge.

9. The method of claim 1, including the additional steps of exposing a high contrast medium to the continuous-tone graphic image a plurality of times there being one exposure for each of a plurality of different colors to produce a plurality of dot exposure patterns, the dots of each respective exposure pattern having a size corresponding to the respective color tone of the graphic image in the region of the respective dot; and superimposing a plurality of said color dot exposure patterns each dot pattern colored with a different respective color and with the colored dots of each color pattern directly superimposed upon the other colored dots of the other patterns and the superposition being free of angular rotation of the respective dot patterns relative to each other to reproduce the original continuous-tone graphic image in color.

* * * * *